United States Patent [19]
Chang

[11] Patent Number: 5,737,259
[45] Date of Patent: Apr. 7, 1998

[54] METHOD OF DECODING A DIODE TYPE READ ONLY MEMORY

[75] Inventor: Kuang Yeh Chang, Taipei, Taiwan

[73] Assignee: United Microelectronics Corporation, Taipei, Taiwan

[21] Appl. No.: 775,168

[22] Filed: Dec. 31, 1996

[30] Foreign Application Priority Data

Nov. 22, 1996 [TW] Taiwan ............... 85114441

[51] Int. Cl.$^6$ ................................ G11C 17/06
[52] U.S. Cl. ............... 365/105; 365/94; 365/175; 257/46; 257/104; 257/212
[58] Field of Search ................ 365/105, 175, 365/186, 94; 257/46, 104, 212

[56] References Cited

U.S. PATENT DOCUMENTS

| | | | |
|---|---|---|---|
| 4,233,671 | 11/1980 | Gerzberg et al. | 365/105 |
| 4,442,507 | 4/1984 | Roesner | 365/105 |
| 4,462,088 | 7/1984 | Giuliani et al. | 365/105 |
| 4,884,238 | 11/1989 | Lee et al. | 365/105 |

*Primary Examiner*—Vu A. Le
*Attorney, Agent, or Firm*—Rabin, Champagne, & Lynt, P.C.

[57] ABSTRACT

A diode type read only memory (ROM) includes a diode as a memory cell. The diode is a logic level "on" memory cell and coupled to one of the word lines and one of the bit lines of the ROM. A relative high voltage is given to the bit line coupled to the diode and a relative low voltage is given to the corresponding word line. Therefore, the data saved in the diode can be read out.

8 Claims, 3 Drawing Sheets

5,737,259

1

METHOD OF DECODING A DIODE TYPE READ ONLY MEMORY

BACKGROUND OF THE INVENTION

1. Field of the Invention

The invention relates in general to a decoding method of a read only memory (ROM), and more particularly to a decoding method of a diode-type ROM array.

2. Description of the Related Art

ROM has been widely applied in digital instruments, such as mini-computer and micro-processor. ROM is used for saving data, such as basic input output system (BIOS), which is not desired to be erased even though the power supply is stopped.

The commonly used ROM uses channel transistors as memory cells. In a process step of programming, dopants are selectively implanted into a certain channel region to adjust the threshold voltage to control the memory cell to be either on or off. FIG. 1 is a top view of a portion of a conventional ROM structure. Polysilicon word lines WL10 are formed over bit lines BL12. The channel regions 14 are the regions under word lines WL10 and between the bit lines BL12. Binary data, 0 or 1, saved in each memory cell is depended on whether ions is implanted into the channel region 14 or not.

FIG. 2 is the equivalent circuit diagram of a conventional ROM 20. ROM 20 includes a number of word lines WLs which are aligned as parallel arrays and a number of bit lines BLs which are also aligned as parallel arrays. The purpose of saving data is approached by the combination of different threshold voltages of different memory cells. Logical level "on" or "0" is saved in a transistor 22, which is located at the intersection of bit lines BL2, BL3 and word line WL2, by forming the transitor with a relative low threshold voltage. Logical level "off" or "1" is saved in a transistor 24, which is located at the crossing site of bit lines BL3, BL4 and word line WL1, by forming the transistor with a relative high threshold voltage. By measuring the output current of the memory cell, the data saved in the memory cell can be read out, after a certain potentials are given to relative bit lines and a word line of a memory cell. A memory cell 22, which is a transistor having a relative low threshold voltage, is taken as an example. The word line WL2 and the bit line BL2, which are both connected to the transistor 22, are both given a high voltage. A low voltage is given to the bit line BL3. Since the transistor 22 has a relative low threshold voltage and is therefore "on", current flows from bit line BL2 through transistor 22 to bit line BL3, as arrow 25 shows. Therefore, a current signal can be detected in bit line BL2 and the data saved can be read out as "0" or "on". To make sure that the current will not flow to the bit line BL1, if the adjacent memory cell 26 also has a relative low threshold voltage, a relative high voltage is given to the bit line BL1. The other bit lines, such as BL3 and BL4, float. A transistor 24 is taken as an example of a memory cell having a relative high threshold voltage. The word line WL1 and the bit line BL3, which are both connected to the transistor 24, are both given a high voltage. A low voltage is given to the bit line BL4. The transistor 24 has a relative high threshold voltage and is therefore "off". Therefore, current signal can not be detected in bit line BL3 and the data saved can be read out as "1" or "off".

For the above-mentioned conventional ROM, two of the bit lines have to be given a high voltage and another one of the bit lines has to be given a low voltage for decoding in order to prevent a reverse current. Since the breakdown voltage of the junction between the bit line and the channel is about 3 voltage, the operating voltage for decoding is limited to be less than 3 voltage, which results in difficulty in reading information. Moreover, the electric resistance of the heavily doped bit line about 100 $\Omega/\Box$ ($\Omega$ per square) is too high, which is, to increase the operating current and speed up decoding.

SUMMARY OF THE INVENTION

It is therefore an object of the invention to provide a decoding method for a ROM, especially for a diode type ROM. Using a diode as a memory cell successfully increases the operating current.

It is another object of the invention to provide a decoding method for a diode type ROM. Only one bit line has to be given a certain voltage but without reverse current and floating bit line.

It is another object of the invention to provide a decoding method for a diode type ROM, using a diode as a memory cell. Therefore, the operating voltage can be more than 10 voltage.

The invention achieves the above-identified objects by providing a method of decoding a diode type read only memory. The read only memory includes at least a first memory cell and at least a second memory cell. The first memory cell is a diode and is coupled to a first bit line and a corresponding first word line. The second memory cell has a logic data "off" and is coupled to a second bit line and a corresponding second word line. A relative high voltage is provided to one of the first bit line and the second bit line. A relative low voltage is provided the first word line if the first bit line is provided with a relative high voltage. On the other hand, a relative low voltage is provided the second word line if the second bit line is provided with a relative high voltage.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
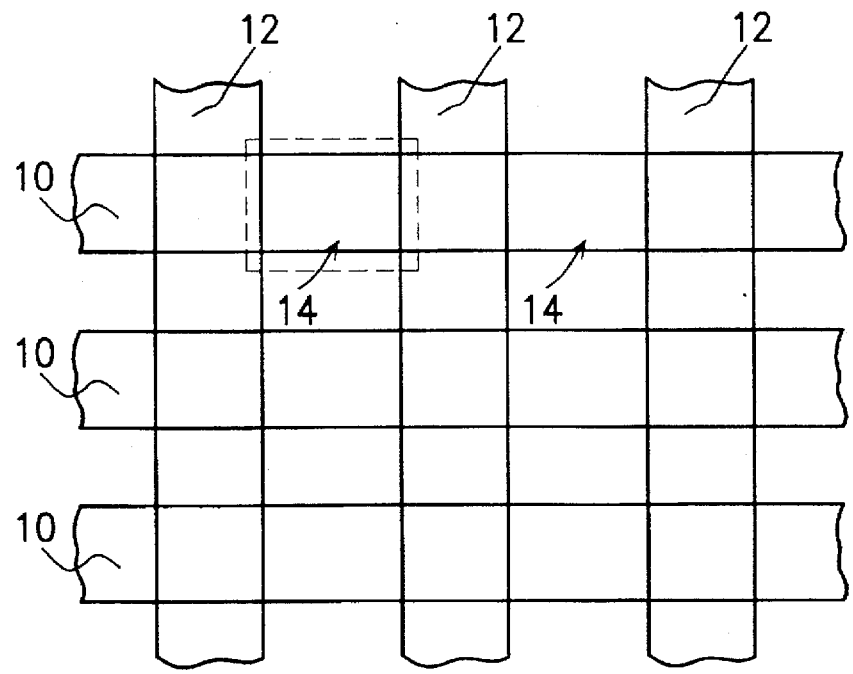
FIG. 1 is a top view of a potion of the conventional ROM.
Figure 2:
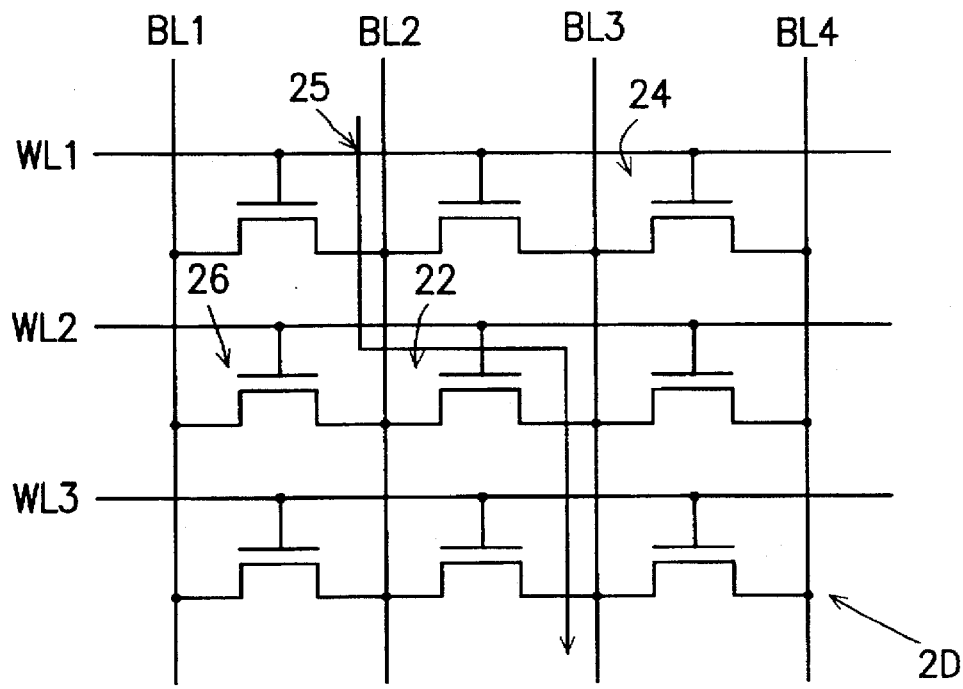
FIG. 2 is an equivalent circuit diagram of a potion of the conventional ROM.
Figure 3:
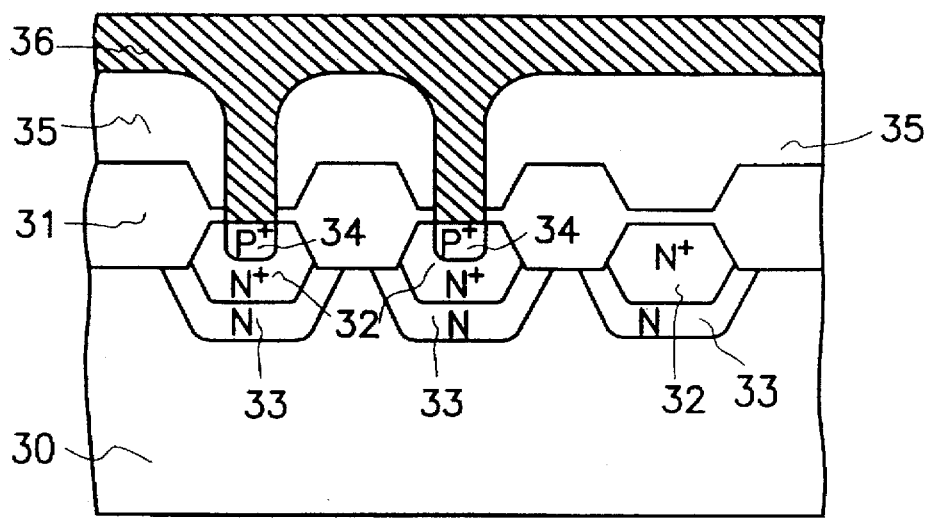
FIG. 3 is a cross-sectional view of a diode type ROM in accordance with a preferred embodiment of the invention.

Referring to FIG. 3, a number of substantially parallel heavily N-type ion doped diffusion regions 32 are formed in a P-type substrate 30. These heavily N-type ion doped diffusion regions 32 are located in active regions surrounded by field oxide layers 31 and are used as bit lines of a ROM. Lightly N-type ion doped diffusion regions 33 are formed below the heavily N-type ion doped diffusion regions 32. Heavily P-type ion doped diffusion regions 34 are formed in some of the heavily N-type ion doped diffusion regions 32. The heavily N-type ion doped diffusion regions 32 and the heavily P-type ion doped diffusion regions 34 therefore form a number of PN diodes with horizontal diode structures. An insulating layer 35 is formed over the substrate 30. A number of substantially parallel metal lines 36 are formed on and through the insulating layer 35 to be coupled to the heavily P-type ion doped diffusion regions. The metal lines 36 are used as word lines and are substantially orthogonal to the bit lines, the heavily N-type ion doped diffusion regions 32.

Figure 4:
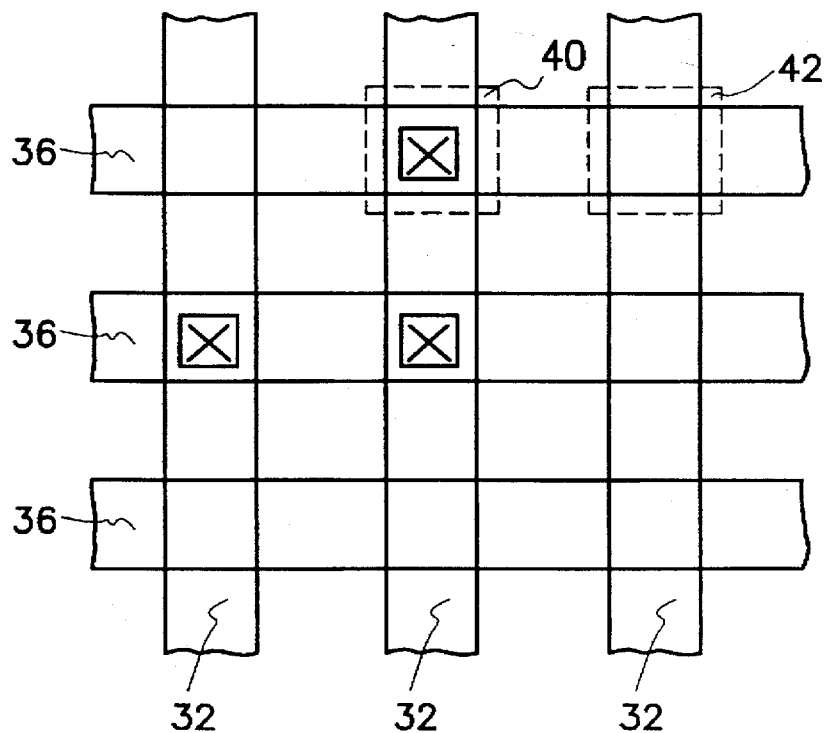
FIG. 4 is a top view of a potion of the diode type ROM in accordance with a preferred embodiment of the invention.

Referring to FIG. 4, the crossing site of one of the bit lines 32 and one of the word lines 36 is a memory cell, for example, the region 40 and the region 42 which are surrounded by dot lines. The memory cell 40, including a P-type ion doped diffusion region and a contact( symbolized by an "X" sign ) besides a N-type ion doped diffusion region, forms a diode. Therefore, the memory cell 40 is "on". On the other hand, the memory cell 42, without both a P-type ion doped diffusion region and a contact, is "off".

Figure 5:
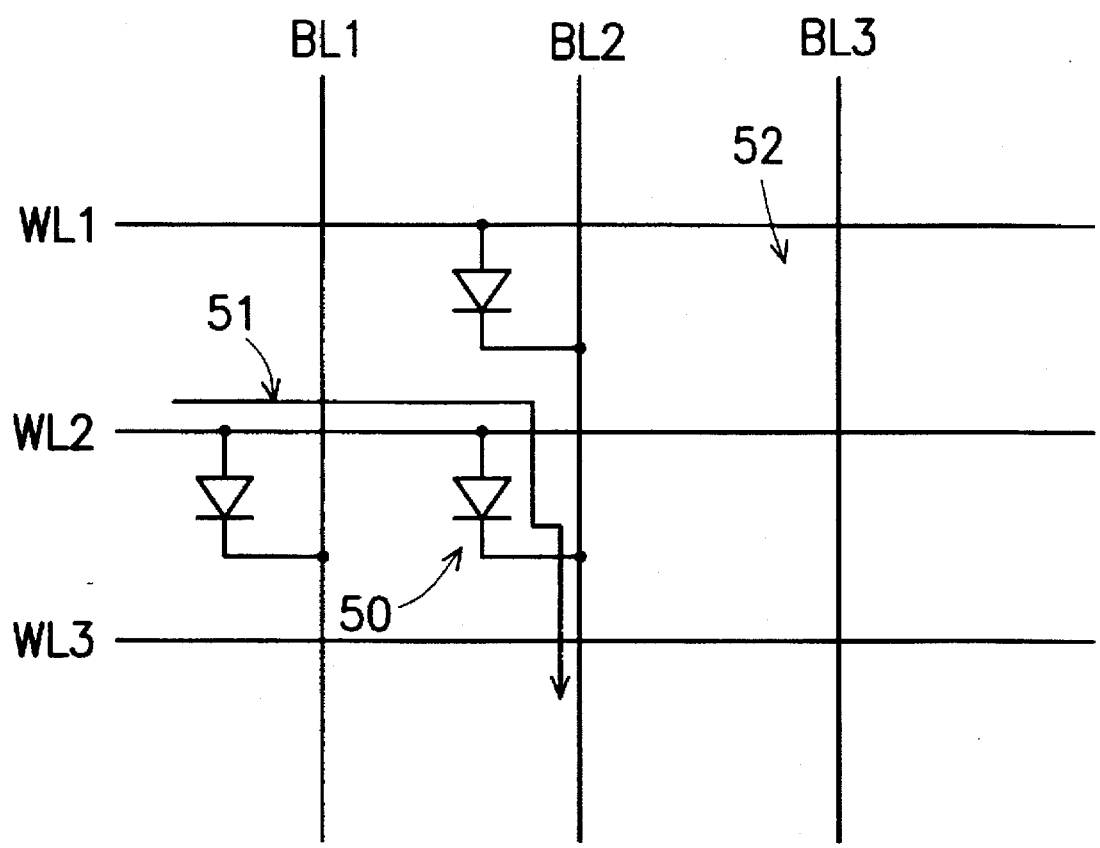
FIG. 5 is an equivalent circuit diagram of a the diode type ROM in accordance with a preferred embodiment of the invention.

Referring to FIG. 5, a memory cell 50, which is a diode, is selected to be read. A relative high voltage, such as 5 volt, is given to a word line WL2. The word line WL2 is coupled to the memory cell 50. A relative low voltage, such as 0 volt, is given to a bit line BL2. The bit line BL2 is coupled to the memory cell 50. The other word lines are given a relative low voltage like 0 volt and the other bit lines are given a relative high voltage like 5 volt. Therefore, current flows from the word line WL2 through the memory cell 50 to the bit line BL2 as the arrow 51 shows. Thus, the data saved in the memory cell 50 can be read out as logical level "1" or "on".

If, on the other hand an "off" memory cell 52 is selected to be read, a relative high voltage, such as 5 volt, is given to a word line WL1. The WL1 is coupled to the memory cell 52. A relative low voltage, such as 0 volt, is given to a bit line BL3. The BL3 is coupled to the memory cell 52. The other word lines are given a relative low voltage like 0 volt and the other bit lines are given a relative high voltage like 5 volt. Therefore, current will not be able to flow from the word line WL1. Thus, the data saved in the memory cell 52 can be read out as logical level "0" or "off".

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of decoding a diode-type read only memory, the read only memory comprising at least a first memory cell and a second memory cell, wherein the first memory cell is a diode and is coupled to a first bit line and a corresponding first word line, and the second memory cell has a logic data "off" and is coupled to a second bit line and a corresponding second word line, wherein the method comprises:

forming the diode with a horizontal diode structure by forming a first conductivity-type diffusion region in a second conductivity-type diffusion region so that the second conductivity-type region partially encloses the first conductivity-type region;

providing a first voltage to one of the first bit line and the second bit line; and providing a second voltage to the one of the first word line and the second word line which is corresponding to the one of the first bit line and the second bit line provided with the first voltage, wherein the first voltage is sufficiently lower than the second voltage that a closed circuit which includes the first bit line, the first memory cell and the first word line is formed when the one of the first and second bit lines is the first bit line and the one of the first word line and the second word line is the first word line, and that a closed circuit which includes the second bit line, the second memory cell and the second word line is not formed when the one of the first and second bit lines is the first bit line and the one of the first and second word lines is the first word line.

2. A method as claimed in claim 1, wherein the first memory cell comprises a P-type dopant diffusion region coupled to the first word line and a N-type dopant diffusion region coupled to the first bit line.

3. A method as claimed in claim 1, wherein the second memory cell comprises a N-type dopant diffusion region coupled to the second bit line.

4. A method as claimed in claim 1, wherein the first word line is the second word line, and the first bit line is not the second bit line.

5. A method as claimed in claim 1, wherein the first bit line is the second bit line, and the first word line is not the second word line.

6. A method as claimed in claim 1, wherein the first voltage is 5 volt and the second voltage is 0 volt.

7. A method as claimed in claim 1, further comprising connecting the first word line to the first conductivity-type diffusion region.

8. A method as claimed in claim 1, wherein the second conductivity-type diffusion region is a heavily second conductivity-type ion doped diffusion region, and said forming the diode further includes forming a lightly second conductivity-type ion doped diffusion region between the lightly doped region and a first conductivity-type substrate.

* * * * *